United States Patent
Kawakami et al.

[11] Patent Number: 6,042,647
[45] Date of Patent: Mar. 28, 2000

[54] NOZZLE SYSTEM FOR FEEDING TREATMENT LIQUID SUCH AS A LIQUID DEVELOPER ON A WORKPIECE

[75] Inventors: Kazushi Kawakami, Oda-gun; Toshinori Imai, Ibara, both of Japan

[73] Assignee: Tokyo Ohka Kogyo Co., Ltd., Japan

[21] Appl. No.: 09/079,993

[22] Filed: May 15, 1998

[30] Foreign Application Priority Data

| May 16, 1997 | [JP] | Japan | 9-127655 |
| Sep. 8, 1997 | [JP] | Japan | 9-243029 |

[51] Int. Cl.[7] .............. B05D 1/02; B65D 47/00; B67D 3/00
[52] U.S. Cl. .............. 118/320; 118/52; 427/240; 427/425; 222/504; 222/559
[58] Field of Search .............. 118/52, 320; 427/240, 427/425; 222/504, 559

[56] References Cited

U.S. PATENT DOCUMENTS

| 4,579,255 | 4/1986 | Frates et al. | 222/149 |
| 5,405,443 | 4/1995 | Akimoto et al. | 118/668 |
| 5,562,772 | 10/1996 | Neoh | 118/52 |
| 5,747,102 | 5/1998 | Smith et al. | 427/96 |

FOREIGN PATENT DOCUMENTS

| 01020620 | 1/1989 | Japan . |
| 02134748 | 5/1990 | Japan . |
| 04209520 | 7/1992 | Japan . |

OTHER PUBLICATIONS

Gangel, Tetrafluorethylene–Perfluorovinyl Ether Copolymers, Kirk–Othmer Encyclopedia of Chemical Technology (4th Edition), pp. 671–683, 1994.

*Primary Examiner*—Shrive Beck
*Assistant Examiner*—Jennifer Calcagni
*Attorney, Agent, or Firm*—Morrison Law Firm

[57] ABSTRACT

In a nozzle system for feeding treatment liquid, a storage tank is equipped with a nozzle comprising an opening and a stopcock which opens and closes said opening. When the stopcock opens the opening, a predetermined amount of liquid developer is dropped from the tank onto a wafer through a narrow gap between the outer surface of the stopcock and the inner edge of the opening. Thereby, the large amount of the liquid developer can be discharged and diffused on the entire wafer surface for a short time. Besides, the liquid amount is controlled with ease, and damage to the wafer is reduced, which enables a high quality of the development.

8 Claims, 4 Drawing Sheets

6,042,647

NOZZLE SYSTEM FOR FEEDING TREATMENT LIQUID SUCH AS A LIQUID DEVELOPER ON A WORKPIECE

BACKGROUND OF THE INVENTION

This invention relates to a nozzle system which is applied to a wet treatment in manufacturing processes for a semiconductor, a liquid crystal display (LCD), a field emission display (FED) and a plasma display panel (PDP), and feeds treatment liquid such as resist liquid to be dropped down onto a workpiece, and liquid developer for developing the resist on the workpiece.

As for a treatment liquid feeding apparatus which is used in the manufacturing process for a wafer of the semiconductor, there has been conventionally provided a method for dropping down the treatment liquid from a nozzle in order to develop the resist on the workpiece. For achieving a high quality of the development, the liquid developer needs to be diffused with uniformity in a moment, and besides, the dropping of the liquid should not destroy nor give damage to patterns on the workpiece. Therefore, there have been known some conventional nozzle systems such as the one that the liquid is temporarily received in a saucer before dropped down onto the wafer for reducing the damage to the wafer by relieving a pressure for feeding the liquid, a slit type nozzle, a spray type nozzle and a straw type nozzle.

However, the above-described conventional nozzle systems take a long time for discharging the predetermined amount of the treatment liquid. Besides, the nozzle system with the saucer for temporarily receiving the liquid has some difficulty in dropping down the fixed amount of the liquid, and needs some mechanism for sucking in remaining liquid, which increases a cost of the nozzle system itself. The spray type nozzle system is apt to make bubbles in the liquid. The straw type nozzle system also has some difficulty in dropping down the fixed amount of the liquid, and is apt to give damage to the workpiece and make bubbles in the liquid.

SUMMARY OF THE INVENTION

This invention is made to solve the above-mentioned problems. One object of the present invention is to provide a nozzle system for feeding treatment liquid which has the capabilities of discharging a predetermined amount of the liquid for a short time, and controlling the liquid amount with ease, and needs no mechanism for sucking in the remaining liquid, and wherein the damage to the wafer is reduced, so that a high quality in a process is achieved.

Another object of the present invention is to provide a nozzle system for feeding treatment liquid which has the capabilities of diffusing the treatment liquid with uniformity on the workpiece, and regulating liquid temperature with ease, so that high quality in a process is achieved.

In order to achieve the above-mentioned objects, a nozzle system for feeding treatment liquid onto a workpiece comprises: a storage tank for storing the treatment liquid, which is arranged above a spindle chuck for supporting the workpiece; an opening which is located on an underside of the storage tank; and, a stopcock which is arranged so as to move up from and down toward the opening, and opens and closes the opening. In this constitution, the opening and the stopcock constitute a nozzle, and when the stopcock opens the opening by moving up from the opening, the treatment liquid stored in the tank is dropped down onto the workpiece through a gap between an outer surface of the stopcock and an inner edge of the opening.

DETAILED DESCRIPTION OF THE PREFERRED EMBODIMENT OF THE PRESENT INVENTION

This application is based on Patent Applications No. 9-127655 and No. 9-243029 filed in Japan, the contents of which are hereby incorporated by reference.

Figure 1:
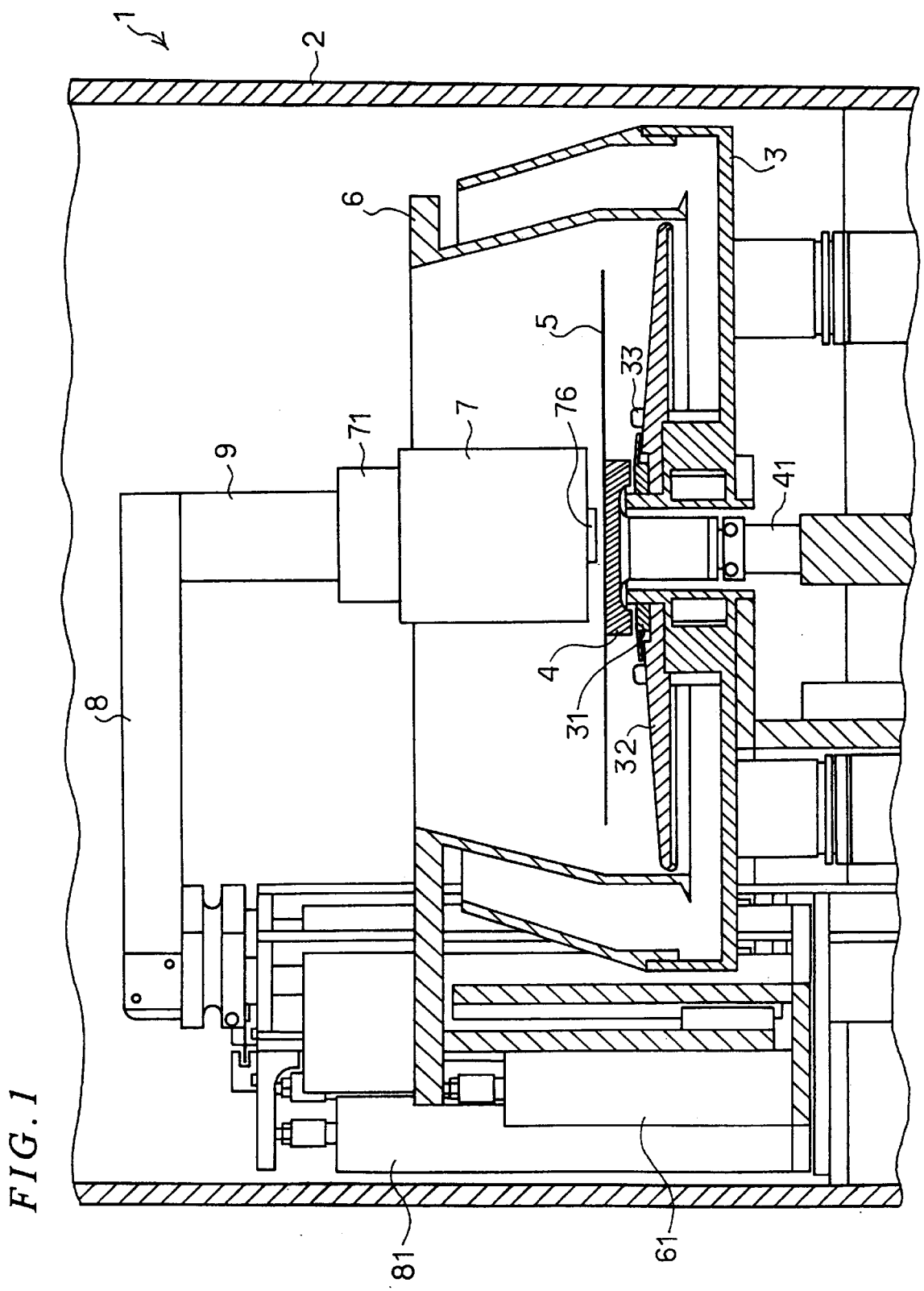
FIG. 1 is a sectional view showing a main part of the development apparatus which is equipped with a nozzle system according to the first embodiment of the present invention.
Figure 2:
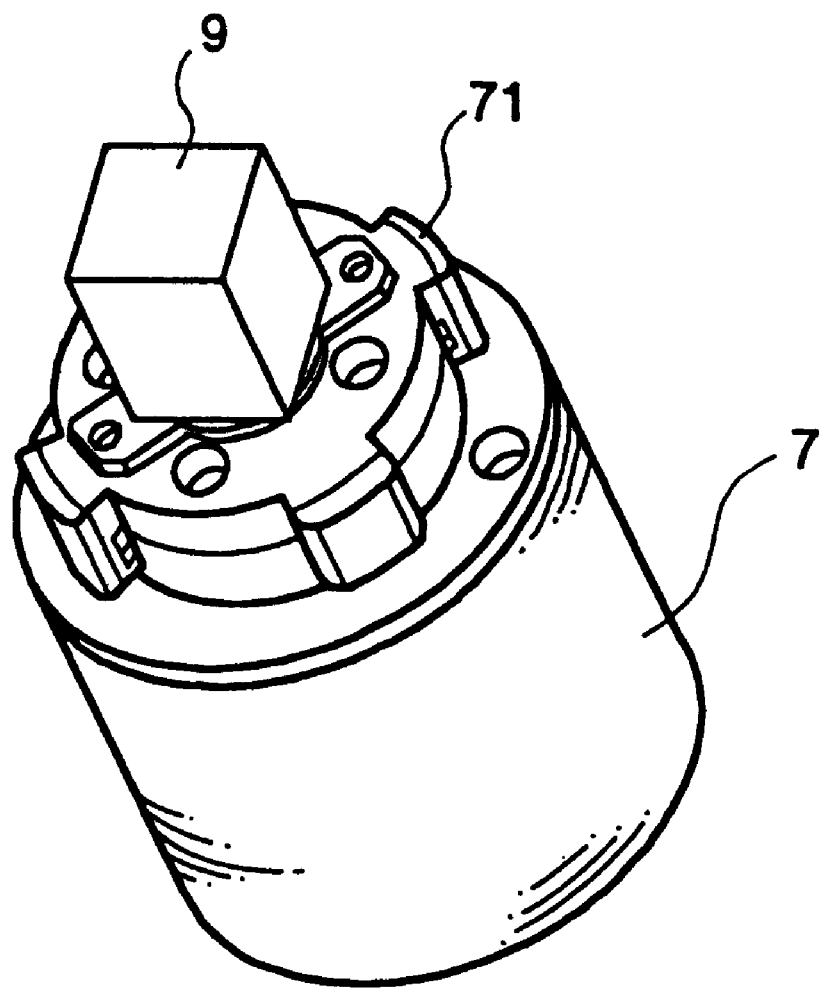
FIG. 2 is an external view of a storage tank including the nozzle system.
Figure 3A:
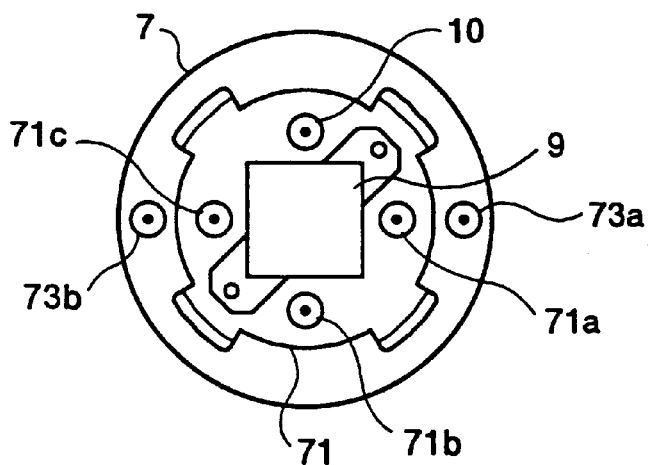
FIGS. 3(a), 3(b) and 3(c) are respectively a plan view, a vertical sectional view and a bottom view of the storage tank, and, FIG. 4 is a vertical sectional view of the storage tank according to a modified embodiment of the present invention.
Figure 3B:
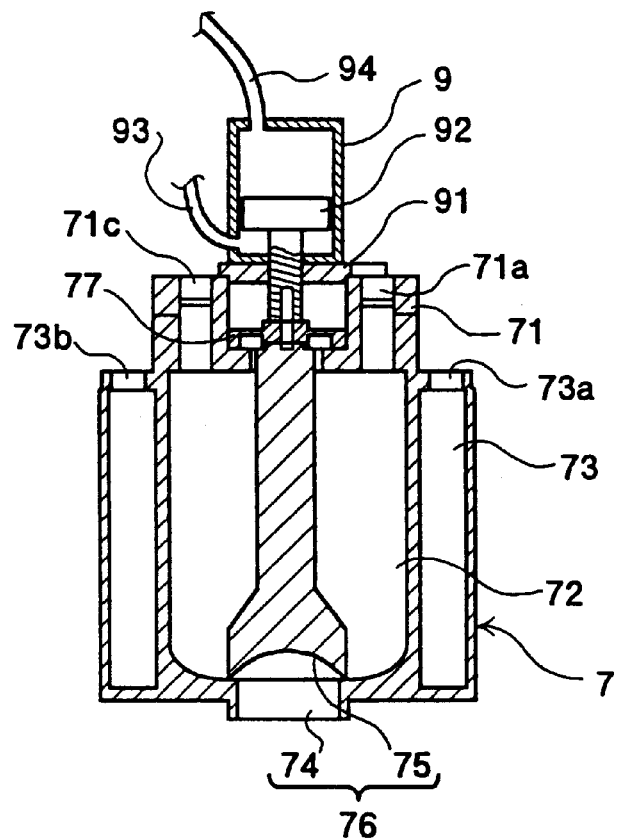
Figure 3C:
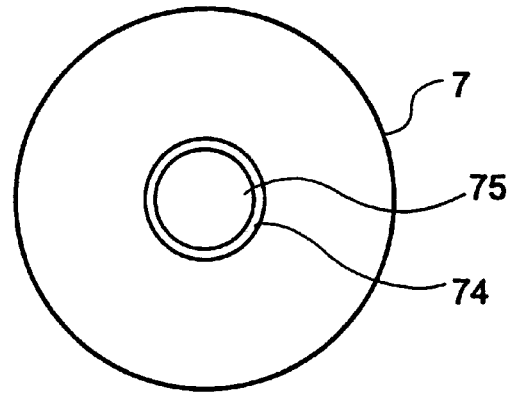

The first embodiment of the present invention will be explained in the following with reference to FIGS. 1 to 3. FIG. 1 shows a development apparatus 1 which is equipped with a nozzle system for discharging liquid developer. The development apparatus 1 comprises a housing 2 including a drain cup 3 in which a spindle chuck 4 for supporting a wafer 5 (300 mm in diameter) as a workpiece by a vacuum suction, is arranged. The spindle chuck 4 is held by a chuck holder 41 which is driven to rotate with moving up toward and down from the center of the drain cup 3. At the foot of the spindle chuck 4, there are provided evener plates 31 and 32 for evening an area flow from above, and a cleaner nozzle 33 for cleaning the underside of the wafer 5. Inside the drain cup 3, there is provided a splash guard 6 being concentric with the drain cup 3, which does not rotate but moves up and down for preventing the liquid from splashing. The spindle chuck 4 (or the wafer 5) straightly comes close to a storage tank 7 which stores the liquid developer and has a nozzle 76 for discharging the liquid developer onto the wafer 5. The storage tank 7 is arranged in a horizontal arm 8 through an air cylinder 9 for opening and closing. The splash guard 6 and the arm 8 are moved up and down respectively by cylinders 61 and 81.

Referring to FIGS. 2, 3(a), 3(b) and 3(c), the storage tank 7 is made from resin with high water repellency such as PFA (tetrafluoroethylene-perfluoroalkylvinylether-copolymer), and equipped on its upper side with a tank lid 71. The storage tank 7 contains a liquid developer chamber 72 for storing the liquid developer, and a temperature regulator jacket 73 for circulating constant temperature water by which the liquid temperature is regulated. The temperature regulator jacket 73 is arranged unitedly with the liquid developer chamber 72 so as to surround it. As shown in the figure, the nozzle 76 in the storage tank 7 is composed of an opening 74 which is arranged on the underside of the liquid developer chamber 72, and a stopcock 75 for opening and closing the opening 74. The stopcock 75 is made from the PFA and the like, and formed in a shape for acting as a packing. The liquid developer chamber 72 has an inner wall of which lower part is formed in a tapered shape which becomes gradually narrower toward the opening 74. The stopcock 75 touches the taper-shaped surface in the liquid developer chamber 72 with its end line in a state of closing the opening 74. In the nozzle 76, the stopcock 75 opens and closes the opening 74 by moving up from and down toward the opening 74. In the opening state, the liquid developer stored in the liquid developer chamber 72 is dropped onto the wafer 5 through a narrow gap between the outer surface of the stopcock 75 and the inner edge of the opening 74. Also, the inner wall of the liquid developer chamber 72 and the surfaces of the opening 74 and stopcock 75 are covered with the water repellent coating for preventing the liquid developer from depositing thereon. Thereby, the liquid developer can be discharged in a fixed amount, and besides, there is no need to provide some system for sucking in the remaining liquid depositing on the inner wall of the liquid developer chamber 72, and the surfaces of the opening 74 and stopcock 75.

The tank lid 71 of the storage tank 7 comprises a liquid inlet 71a for pouring the predetermined amount of the liquid developer into the liquid developer chamber 72, a connection mouth 71b into which an air-exhaust control valve is connected, a connection mouth 71c into which a vacuum degasifier system is connected, and an insertion mouth 10 into which a control sensor for the liquid amount in the tank 7 is inserted. Each of parts and components is connected or inserted into the above-mentioned inlet 71a or mouths via unshown resin tubes. The liquid developer is poured through the inlet 71a by an application of nitrogen gas pressure. The vacuum degasifier system removes bubbles mingling in the liquid developer. Also, the tank lid 71 comprises a constant-temperature water inlet 73a and a constant-temperature water outlet 73b for pouring and discharging the constant-temperature water into and from the jacket 73.

The air cylinder 9 which opens and closes the opening 74 by moving the stopcock 75 up and down, is fixed on the tank lid 71 by a cylinder bracket 91. The stopcock 75 is connected into a cylinder piston 92, and moved up and down by the air supplied through an air-influent tube 93 and an air-exhaust tube 94. In a connection point of the stopcock 75 and the cylinder piston 92, there is provided a diaphragm 77 as a packing which prevents the air from flowing into the liquid developer chamber 72.

Next, the actions of the development apparatus 1 structured as described above will be explained in paragraphs that follow. The wafer 5 as the workpiece is conveyed above the drain cup 3 by a unshown conveyance mechanism, and then passed into the spindle chuck 4 which is in an upper position. Here, the arm 8 driven by the cylinder 81 makes the storage tank 7 come in an upper standby position. Following that, the wafer 5 is positioned inside the drain cup 3 by the spindle chuck 4 moving downward, and the storage tank 7 is positioned closer to the wafer 5 from the upper standby position by the arm 8 moving downward. The predetermined amount of the liquid developer is supplied and stored in the liquid developer chamber 72 of the storage tank 7 at the same time. In this state, the liquid developer is dropped down by opening the nozzle 76, and dispersed onto the wafer 5. The spindle chuck 4 vibrates the wafer 5 by means of an intermittent spinning for dozens of seconds, which contributes the development operation. After that, the storage tank 7 is returned into the standby position, and a unshown nozzle discharges rinse liquid onto the wafer 5, then, the wafer 5 is spun for shaking off the liquid developer, rinse liquid, and the remaining resist liquid. Following the development process, the wafer 5 is taken out from the development apparatus 1 by the conveyance mechanism, and conveyed for a next process such as an etching.

The proper feeding of the liquid needs a combination of the following four points as an essential requirement. (1) Spinning speed of the wafer for feeding the liquid: proper spinning speed of the wafer allows the discharged liquid developer to diffuse on the entire wafer surface for a short time. (2) Distance from the wafer surface to an outlet of the nozzle: if the distance is too long, the dropping speed of the liquid onto the wafer is increased, which gives bigger damage to the wafer. (3) Opening speed of the outlet of the nozzle for discharging the liquid developer: a fast speed of opening the outlet can discharge a large amount of the liquid in a moment. (4) Amount of the liquid developer: the high quality of the development cannot be kept without discharging the fixed amount of the liquid every time.

As a result, the nozzle 76 should satisfy the following five requirements: (1) Diffuse the liquid developer on the entire wafer surface for a short time (2) Discharge the fixed amount of the liquid every time (3) No damage to the wafer (or mask) (4) No occurrence of the bubbles and micro-bubbles; and further, if possible, (5) Make no unevenness in development by the constant temperature of the liquid developer. Supposing that the amount of the liquid developer which is required to diffuse on the entire wafer surface, is 70 ml which takes up 70% of the whole amount of the liquid to be discharged, the nozzle 76 should have a capability of discharging the liquid of 100 ml for a second (=6 L/min.).

According to a discharging experiment (head; 1 meter) through the application of the pressure, a tube needs to have an inner diameter of 8 mm and a strength against a pressure of 0.8 kg/cm$^2$ at least. Stopped being discharged in this state, the liquid is dropped down by a water hammer phenomenon.

In connection with the above-mentioned five points, the nozzle 76 of the present embodiment having the structure for dropping down the liquid developer through the narrow gap between the outer surface of the stopcock 75 and the inner edge of the opening 74, can provide the following effects:

(1) Discharge a large amount of the liquid developer in a moment: when the stopcock 75 of the storage tank 7 is raised up, the nozzle 76 can discharge the liquid in a moment (within one second). Supposing that the liquid is discharged for one second out of 60 seconds of the development process, 59 seconds remain for supplying the liquid in the storage tank 7. Consequently, the diameter of the tube can be decreased, which prevents bubbles from generating in the liquid.

(2) Discharge the fixed amount of the liquid every time: the control sensor for the liquid amount in the tank which is inserted into the mouth 10, sensors the inside of the storage tank 7 for controlling the liquid amount. Thereby, the nozzle system of the present invention in which the liquid is stored in the storage tank 7, can provide a higher accuracy than a conventional nozzle system in which the liquid developer is discharged directly from a tube.

(3) Less damage to the wafer: the liquid is discharged without the pressure, and potential energy of the liquid and the spontaneous dropping speed can be lost by the inside structure of the nozzle (the energy is temporarily received at the lower surface of the nozzle, and the outlet diameter is comparatively large) and the arrangement that the nozzle is close to the wafer. Accordingly, less damage is given to the wafer, and moreover, the liquid can be radiately spread with uniformity on the wafer. Additionally, the liquid developer is organic solvent which has small surface tension.

(4) No occurrence of bubbles and micro-bubbles: the storage tank 7 and the stopcock 75 have shapes that all corners thereof are rounded off, so that the liquid is not collected, and a resistance to the flowing liquid is small. Further, there is no need of a mechanism for sucking in the remaining liquid, so that a cost of the nozzle system can be lowered. Moreover, owing to the systematic structure of the nozzle 76 which makes less difference between the pressures, there occurs no bubbles and micro-bubbles. In addition, if the distance from the wafer to the nozzle 76 is reduced, the damage to the wafer can be more reduced, which makes it possible to avoid shock which causes bubbles. Even if bubbles or micro-bubbles occur inside the tank, the vacuum degasifier system evacuates air by reducing the pressure, thereby the bubbles or the micro-bubbles can be removed.

(5) The temperature regulator jacket 73 in which the constant-temperature water is circulated, surrounds the liquid developer chamber 72, thereby the liquid developer can be easily kept in the constant temperature, so a stable quality of the development can be kept. Besides, it is favorable to regulate the water temperature at a position closest to the liquid developer chamber 72, and seal the liquid developer with ease.

(6) The inner wall of the liquid developer chamber 72, and the surfaces of the opening 74 and the stopcock 75 are covered with the water repellent coating for preventing the liquid developer from depositing thereon. Accordingly, after the liquid developer is discharged, the liquid does not deposit on the inner wall of the liquid developer chamber 72, and the surfaces of the opening 74 and the stopcock 75. Thereby, the liquid does not remain on the inner wall of the liquid developer chamber 72, the liquid developer in the liquid developer chamber 72 can be discharged at all, and the fixed amount of the liquid can be accurately discharged. Besides, there is no need of the mechanism for sucking in the remaining liquid inside the nozzle 72 such as a vacuum sucking mechanism.

Next, supplying and discharging actions of the liquid developer into and from the storage tank 7 will be explained. The stopcock 75 which is connected into an end of the air-cylinder 9, is pressed onto the tapered surface of the inner wall inside the liquid developer 72, by which the opening 74 is closed. In this state, a unshown valve for discharging the liquid is opened for supplying the liquid developer from the inlet 71a into the liquid developer chamber 72. Here, when the air-exhaust valve connected in the connecting mouth 71b is opened, the pressure inside the liquid developer chamber 72 becomes equal to the pressure outside the chamber. The liquid developer can be discharged by raising up the stopcock 75 through the air cylinder 9 with appropriate distance and speed.

The explanation will be now given to a sequence for controlling the liquid amount inside the storage tank 7. For storing the liquid developer of 50 cc into the tank, a unshown liquid surface sensor is fixed at a position for 50 cc in order to detect a liquid surface inside the tank first of all. This is followed by a second step for opening the liquid discharging valve in order to supply the liquid developer from the inlet 71a into the liquid developer chamber 72. Then, at the time that the liquid surface sensor detects that the liquid developer of 50 cc is supplied, a control program of the controller arranged in the developer apparatus measures a time for supplying the 50 cc liquid. According to the measured time, a flow rate of the liquid is calculated, and the calculated flow rate is fed back in the control program. Based on this flow rate, the opening and closing of the liquid discharging valve is controlled. This control allows the fixed amount to be discharged every time. Further, if an external device such as a personal computer is connected to the development apparatus of the present invention for inputting a desired amount of the liquid to be discharged, the control program can control the valve for discharging the desired amount of the liquid.

The development apparatus of the present invention has the above-explained function for temporarily storing the liquid developer in the upper part of the nozzle 76, thereby, the fixed amount of the liquid developer with a proper temperature can be discharged for a short time, and besides, the damage to the wafer is reduced, so that the high quality of the development can be achieved. The inner wall of the liquid developer chamber 72, and the surfaces of the opening 74 and stopcock 75 are covered with the water repellent coating, which makes unnecessary for sucking the remaining liquid inside the nozzle 76. Further, for the purposes of preventing foreign substance from mingling into the liquid developer, and metal ions from flowing out, and moreover, keeping a required amount of the flow rate, it is not proper to use a common pump or a bellows-pump for supplying the liquid developer into the storage tank 7 but desirable to use a method for feeding by a pressure of the nitrogen gas and so on.

Figure 4:
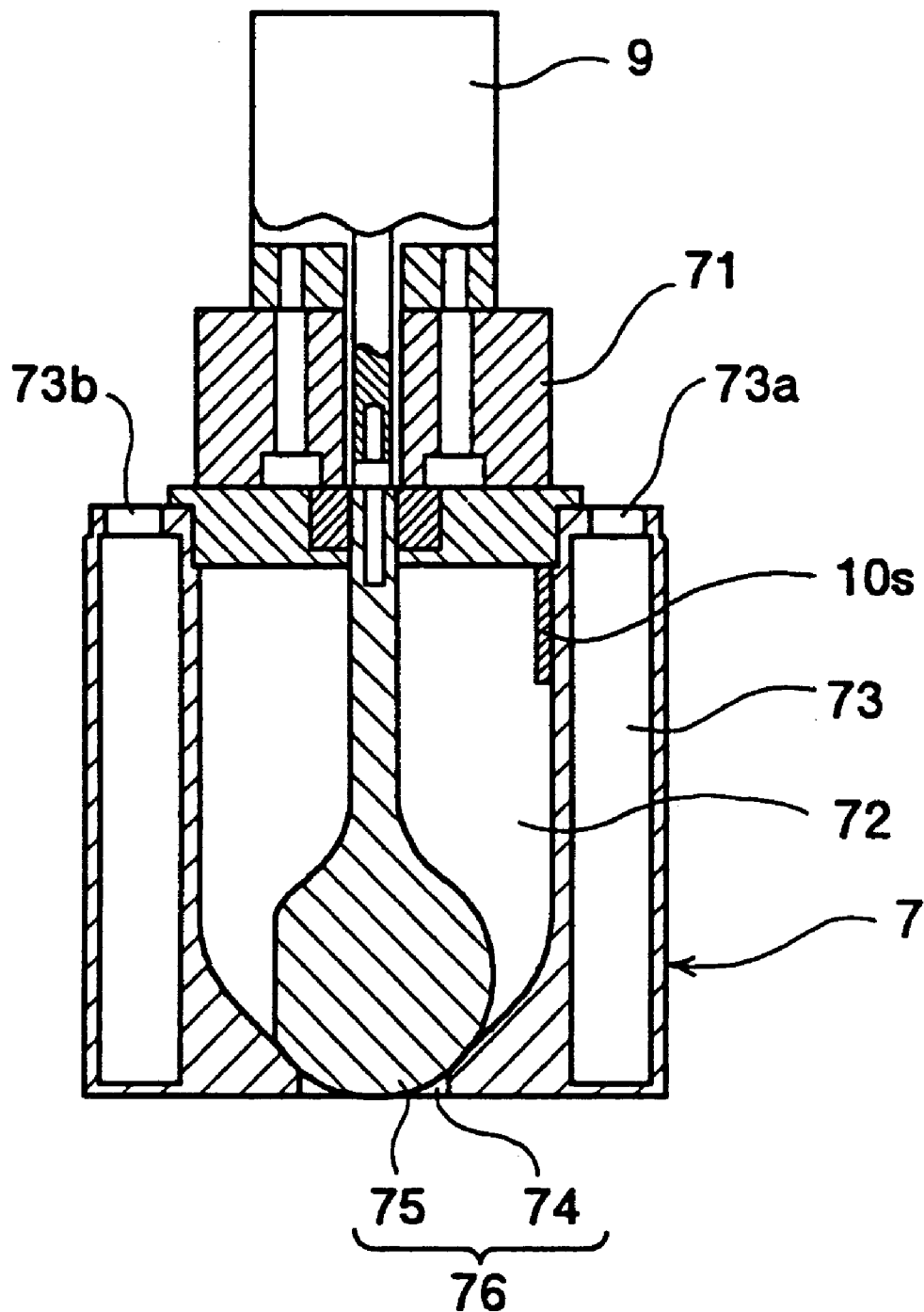

FIG. 4 is a sectional view of a storage tank having a nozzle system according to a modified embodiment of the present invention. In this embodiment, the same components as those of the above-mentioned first embodiment are denoted by the same reference numerals. The storage tank 7 contains the stopcock 75 which is formed in a bulb-like shape, and the liquid developer chamber 72 has an inner wall of which lower part is curved in a bowl-like shape becoming gradually narrower toward the opening 74. The stopcock 75 touches onto the curved surface of the inner wall of the liquid developer chamber 72. Owing to this constitution, opening degree of the opening 74 can be controlled more precisely, which makes it easier to properly control the flow speed of the liquid. The reference numeral 10s denotes a control sensor for the liquid amount inside the tank, which faces toward the inside of the tank.

The present invention is not restricted to the above-described embodiment, but includes varied or modified embodiments from the above. Although the above embodiments explain the nozzle systems to be applied to the development process for a semiconductor wafer, it is also possible to apply the nozzle system to a development process for a liquid crystal glass substrate or an exposure mask, and further to a process of discharging the resist liquid or the etching liquid. Besides, the nozzle system of the present invention can be also applied to a nozzle for discharging the rinse liquid. If the nozzle system of the present invention is applied to the structure for discharging the rinse liquid, the rinse liquid can be discharged for the equal time of discharging the liquid developer. Thereby, the rinse liquid can be fed with decreasing a time lag between the center and the periphery of the wafer 5, which enables a higher quality of development.

What is claimed is:

1. A nozzle system for feeding a treatment liquid onto a workpiece supported on a spindle chuck comprising:

a storage tank, the storage tank having an inner wall defining a chamber wherein treatment liquid can be stored, a lower part of the inner wall tapering toward and communicating with an opening at the underside of said storage tank, said storage tank being movable to position said tank underside close to and above the workpiece, a stopcock in said storage tank, said stopcock being movable between a closed position wherein it closes said opening to an open position away from said opening wherein said stopcock comprises with said opening a nozzle gap through which by spontaneous dropping movement an outflow of treatment liquid discharges from said storage tank opening directly onto said workpiece.

2. A nozzle system for feeding treatment liquid onto a workpiece as claimed in claim 1 wherein surfaces of the opening and the stopcock, and the inner wall of the storage tank are covered with a water repellant coating.

3. A nozzle system for feeding treatment liquid onto a workpiece as claimed in claim 2, wherein the stopcock is made from a resin material having a high water repellency.

4. A nozzle system for feeding treatment liquid onto a workpiece as claimed in claim 1, wherein the storage tank is movable upward and downward by an up-down cylinder, the spindle chuck rotatably supporting and moving up and down the workpiece, and wherein a distance between the nozzle and workpiece is adjustable.

5. A nozzle system for feeding treatment liquid onto a workpiece as claimed in claim 1, further comprising a jacket which is arranged unitedly with the storage tank so as to surround the storage tank, and in which liquid for regulating temperature of the liquid inside the storage tank is circulated.

6. A nozzle system for feeding treatment liquid onto a workpiece as claimed in claim 1, wherein the storage tank contains a liquid surface sensor which senses and controls an amount of the liquid stored in the storage tank.

7. A nozzle system for feeding treatment liquid onto a workpiece as claimed in claim 6, further comprising a control system which calculates a flow rate of the liquid based on a time for supplying the liquid in the storage tank, controls the time for supplying the liquid in the storage tank according to the calculated flow rate, and sets up a selected amount of the liquid to be stored.

8. A nozzle system for feeding a treatment liquid onto a workpiece supported on a spindle chuck comprising:

a storage tank, the storage tank having an inner wall defining a chamber wherein treatment liquid can be stored, an opening at the underside of said storage tank, said storage tank being movable to position said tank underside proximal to and above the workpiece, a stopcock in said storage tank, said stopcock being movable between a closed position wherein it closes said opening to an open position away from said opening wherein said stopcock comprises with said opening a nozzle gap through which by spontaneous dropping movement an outflow of treatment liquid discharges from said storage tank opening directly onto said workpiece, wherein the stopcock is formed in a bulb-like shape, and a lower part of the inner wall of the storage tank is curved in a bowl-like shape which becomes narrower toward and communicates with the opening, and wherein the stopcock touches the bowl-like curved wall of the storage tank when the stopcock closes the opening.

* * * * *

UNITED STATES PATENT AND TRADEMARK OFFICE
CERTIFICATE OF CORRECTION

PATENT NO. : 6,042,647  
APPLICATION NO. : 09/079993  
DATED : March 28, 2000  
INVENTOR(S) : Kazushi Kawakami et al.

Page 1 of 1

It is certified that error appears in the above-identified patent and that said Letters Patent is hereby corrected as shown below:

Title Page, Item (73) Assignee:

Please delete "Tokyo Ohka Kogyo Co., Ltd.," and insert --Tokyo Ohka Kogyo Co., Ltd., Kanagawa, Japan--

Please insert --Tazmo Co., Ltd., Okayama, Japan--

Signed and Sealed this

Twenty-seventh Day of November, 2007

JON W. DUDAS  
*Director of the United States Patent and Trademark Office*